(12) United States Patent
Sun et al.

(10) Patent No.: US 12,349,391 B2
(45) Date of Patent: Jul. 1, 2025

(54) RF POWER TRANSISTOR HAVING OFF-AXIS LAYOUT

(71) Applicant: Microwave Technology Inc., Fremont, CA (US)

(72) Inventors: Howard J. Sun, Newark, CA (US); Guo-Gang Zhou, Kentfield, CA (US)

(73) Assignee: Microwave Technology Inc., Fremont, CA (US)

( * ) Notice: Subject to any disclaimer, the term of this patent is extended or adjusted under 35 U.S.C. 154(b) by 181 days.

(21) Appl. No.: 17/965,753

(22) Filed: Oct. 13, 2022

(65) Prior Publication Data
US 2024/0128368 A1 Apr. 18, 2024

(51) Int. Cl.
*H10D 30/47* (2025.01)
*H10D 62/824* (2025.01)
*H10D 64/23* (2025.01)
*H10D 64/27* (2025.01)
*H03F 3/213* (2006.01)

(52) U.S. Cl.
CPC ......... *H10D 30/477* (2025.01); *H10D 30/472* (2025.01); *H10D 62/824* (2025.01); *H10D 64/257* (2025.01); *H10D 64/411* (2025.01); *H03F 3/213* (2013.01)

(58) Field of Classification Search
CPC ........... H01L 29/2003; H01L 29/41758; H01L 29/778–7789; H01L 23/66
See application file for complete search history.

(56) References Cited

U.S. PATENT DOCUMENTS

| 7,071,783 | B2 | 7/2006 | Ichitsubo et al. | 330/285 |
| 7,745,848 | B1 * | 6/2010 | Rajagopal | H01L 23/3677 |
| | | | | 438/285 |
| 2005/0189562 | A1 * | 9/2005 | Kinzer | H01L 29/41758 |
| | | | | 257/E27.012 |
| 2011/0018624 | A1 | 1/2011 | Kobayashi et al. | 327/574 |
| 2017/0104063 | A1 * | 4/2017 | Zhang | H01L 29/41758 |

OTHER PUBLICATIONS

HMC7543 Data Sheet, "71 GHz to 76 GHz, E-Band Power Amplifier With Power Detector," Rev A., Analog Devices, 16 pages (2016).

(Continued)

*Primary Examiner* — Eric A. Ward
(74) *Attorney, Agent, or Firm* — Imperium Patent Works LLP; T. Lester Wallace (57) ABSTRACT

A high frequency RF power transistor includes first and second elongated mesas. In one example, the transistor is part of a millimeter wave MMIC power amplifier. From the top-down perspective, the two mesas are disposed in an off-axis and staggered orientation with respect to one another. A branched gate electrode is formed such that a first branch from a gate signal input location to the first mesa is the same length as a second branch from the input location to the second mesa. Likewise, a branched drain electrode is formed such that a first branch from the first mesa to a drain signal output location is the same length as a second branch from the second mesa to the output location. The off-axis and staggered orientation of the mesas spreads heat generation across the integrated circuit and reduces circuit size in the critical dimension perpendicular to signal flow direction.

8 Claims, 6 Drawing Sheets

TWO-MESA RF POWER TRANSISTOR (56) References Cited

OTHER PUBLICATIONS

MAAP-011146-DIE Data Sheet, "Power Amplifier, 3 W, 21.15-23.65 GHz", Rev. V1, Macom Technology Solutions, 7 pages.
"AN02 Microsemi MMIC Amplifiers with On-Chip Power Detectors," Rev. C, Microsemi Corporation, 7 pages (Oct. 2014).
XP1017-BD Data Sheet, 30.0-36.0 GHz GaAs MMIC Power Amplifier, Rev. 23, Mimix Broadband, 8 pages (Jan. 2010).
XP1039-QJ Data Sheet, 2.5 W Power Amplifier 5.6-7.1 GHz, Rev. V1, Macom Technology Solutions, 8 pages.
MMA-273336-M5 Data Sheet, MWT 27-33GHz 4W MMIC Power Amplifier, Microwave Technology Inc., 10 pages (May 2018).
MMA-061827 Preliminary Data Sheet, MWT 6-18 GHz Power Amplifier MMIC Chip, Microwave Technology Inc., 5 pages (Jun. 2008).
MMA-283136 Data Sheet, MWT 28-31 GHz 4W MMIC Power Amplifier, Microwave Technology Inc., 10 pages (Nov. 2012).
AN-653 Application Note, "Improving Temperature, Stability, and Linearity of High Dynamic Range RMS RF Power Detectors," Analog Devices, Rev. A, 8 pages (2003).

\* cited by examiner

POWER AMPLIFIER INTEGRATED CIRCUIT

FIG. 3

TWO-MESA RF POWER TRANSISTOR

TOP-DOWN VIEW OF A PART OF
THE TWO-MESA PHMET OF FIG. 4

FIG. 6

CROSS-SECTIONAL VIEW OF A PART OF THE TWO-MESA
PHEMT TAKEN ALONG SECTIONAL LINE B-B' OF FIG. 6

FIG. 7

CROSS-SECTINOAL VIEW OF A PART OF THE TWO-MESA
PHEMT TAKEN ALONG SECTIONAL LINE A-A' OF FIG. 6

RF POWER TRANSISTOR HAVING OFF-AXIS LAYOUT

TECHNICAL FIELD

The described embodiments relate to RF power transistors, and to related structures and methods.

BACKGROUND INFORMATION

The power amplifier of a high frequency power amplifier integrated circuit operable in the 1 GHz to 100 GHz frequency range typically has multiple stages. The largest transistor of the power amplifier is generally found in the final stage. In the case of a mesa pHMET-type transistor, the transistor is typically physically long in one direction. Due to its function and size, this large transistor dissipates a large amount of heat so its location is often also the location of highest temperature on the integrated circuit. Providing a size-efficient integrated circuit layout with acceptably uniform power dissipation across the surface of the integrated circuit is a concern in power amplifier design.

Figure 1:
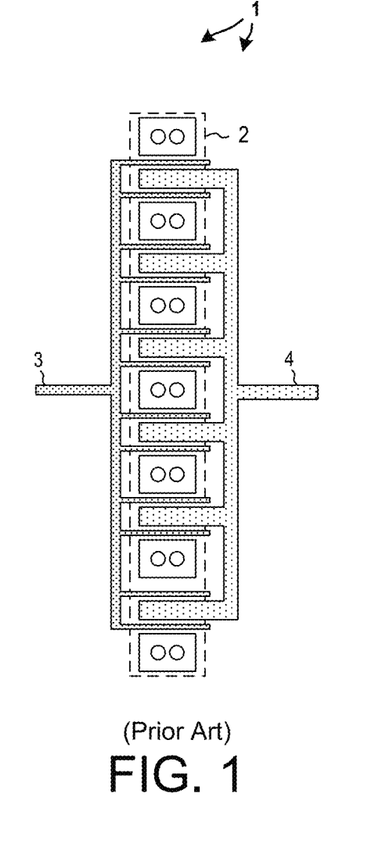
FIG. 1 (Prior Art) is a top-down diagram of a prior art transistor structure consisting of a single column of transistor units.

FIG. 1 (Prior Art) is a top-down diagram of one such transistor structure 1. As is typical of large power transistors of this type, the transistor structure consists of multiple identical smaller transistor units that are organized in a column on a column-shaped mesa 2. In high frequency design, supplying an incoming signal to all the various smaller unit transistors so that incoming signal reaches the unit transistors in uniform fashion at substantially at the same time is important. Accordingly, an input gate signal distribution electrode 3 extends transversely toward the middle of the column, with the gate electrode branching out symmetrically to many thin parallel-extending gate fingers. Likewise, many drain fingers from the column extend transversely away from the column in the opposite direction. These drain fingers merge together in a symmetrical branching fashion into a transversely extending drain electrode 4. If the transistor is large and long, then localized power generation can become a problem because so much heat is generated by the one localized mesa.

Figure 2:
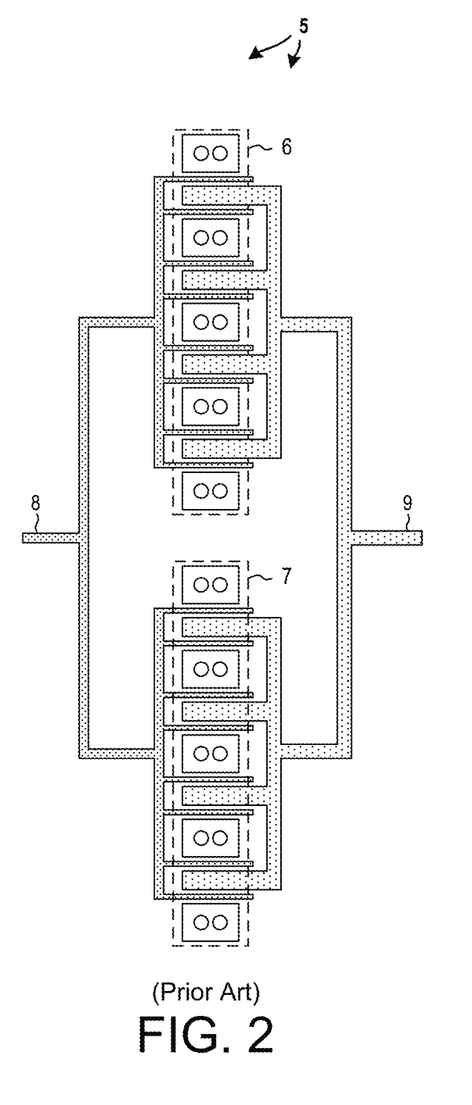
FIG. 2 (Prior Art) is a top-down diagram of a prior art transistor structure consisting of two columns of transistor units.

FIG. 2 (Prior Art) is a top-down diagram of a transistor layout sometimes employed where the transistor structure would otherwise be undesirably long and large. The units of the transistor structure 5 are laid out in two separated column-shaped mesas 6 and 7. Colinear mesa orientation facilitates symmetrically-branched electrode structures 8 and 9 that supply signals to, and take signals from, the overall multi-column structure. The physical separation between the two mesas helps spread heat generation across the surface of the integrated circuit.

SUMMARY

A high-frequency RF transistor integrated circuit structure is operable in the 1 GHz to 100 GHz frequency range. The integrated circuit includes a first elongated mesa, a second elongated mesa, a first plurality of parallel-extending gate fingers, a second plurality of parallel-extending gate fingers, a branched gate electrode, a first plurality of drain fingers, a second plurality of drain fingers, and a branched drain electrode. From the top-down perspective, the two elongated mesas are disposed with respect to one another on the top of the integrated circuit in an off-axis and staggered fashion. In one embodiment, the RF transistor is a gallium-arsenide (GaAs) pHMET (pseudomorphic High Mobility Electron Transistor).

The first elongated mesa extends longitudinally along a first longitudinal axis L1 from the first mesa end of the first mesa to the second mesa end of the first mesa. The second elongated mesa extends longitudinally along a second longitudinal axis L2 from a first mesa end of the second mesa to a second mesa end of the second mesa. The first longitudinal axis L1 is parallel to the second longitudinal axis L2. The two mesas are axis-offset with respect to one another such that a line L3 extending from the first mesa end of the first mesa in a direction perpendicular to the first longitudinal axis L1 intersects the second longitudinal axis L2 and also passes through the second mesa. A line L4 extending from the second mesa end of the first mesa in a direction perpendicular to the first longitudinal axis L1 intersects the second longitudinal axis L2 but does not pass through the second mesa.

The two elongated mesas are of the same length. Namely, the distance from the first mesa end of the first mesa to the second mesa end of the first mesa is the same as the distance from the first mesa end of the second mesa to the second mesa end of the second mesa.

The branched gate electrode has a first gate electrode portion and a second gate electrode portion. The first gate electrode portion extends from a gate electrode intersection location to the first plurality of parallel-extending gate fingers of the first mesa. The second gate electrode portion extends from the gate electrode intersection location to the second plurality of parallel-extending gate fingers of the second mesa. Although the branched gate electrode is asymmetrical when viewed from the top-down perspective, the length of the first gate electrode portion is identical to the length of the second gate electrode portion.

The branched drain electrode has a first drain electrode portion and a second drain electrode portion. The first drain electrode portion extends from the first plurality of parallel-extending drain fingers of the first mesa to a drain electrode intersection location. The second drain electrode portion extends from the second plurality of parallel-extending drain fingers of the second mesa to the drain electrode intersection location. Although the branched drain electrode is asymmetrical when viewed from the top-down perspective, the length of the first drain electrode portion is identical to the length of the second drain electrode portion.

In one embodiment, the RF transistor structure further includes a first plurality of source electrodes disposed on the first mesa, and a second plurality of source electrodes disposed on the second mesa. Each of the first plurality of source electrodes is coupled to a metal layer on the bottom of a substrate by one or more through-chip vias that extend from the source electrodes on top of the first mesa, down through the mesa and through other semiconductor layers of the integrated circuit, and to the source metal on the bottom of the substrate. Likewise, each of the second plurality of source electrodes is coupled to the metal layer on the bottom of the substrate by one or more through-chip vias that extend from the source electrodes on top of the second mesa, down through the second mesa and other semiconductor layers of the integrated circuit, and to the source metal on the bottom of the substrate.

Due to the off-axis offset and staggered orientation of the first and second mesa with respect to one another, the overall RF transistor integrated circuit structure is of reduced size in the direction perpendicular to signal flow. The direction of signal flow, roughly from the gate electrode location of the gate electrode to the drain electrode intersection location of the drain electrode, is perpendicular to the first and second longitudinal axes L1 and L2. Importantly, the overall size of the RF transistor in this direction perpendicular to signal flow is smaller than the combined total length of the two mesas. For some applications, for example for phased array antenna applications, the length of the transistor in this direction is critical. Moreover, due to the RF transistor integrated circuit structure involving mesas that are separated from one other, heat generated by the RF transistor structure is better spread out over the integrated circuit area as compared to a conventional RF transistor mesa layout that does not involve the off-axis and staggered mesa layout.

Further details and embodiments and techniques are described in the detailed description below. This summary does not purport to define the invention. The invention is defined by the claims

BRIEF DESCRIPTION OF THE DRAWINGS

The accompanying drawings, where like numerals indicate like components, illustrate embodiments of the invention.

DETAILED DESCRIPTION

Reference will now be made in detail to embodiments of the invention, examples of which are illustrated in the accompanying drawings.

Figure 3:
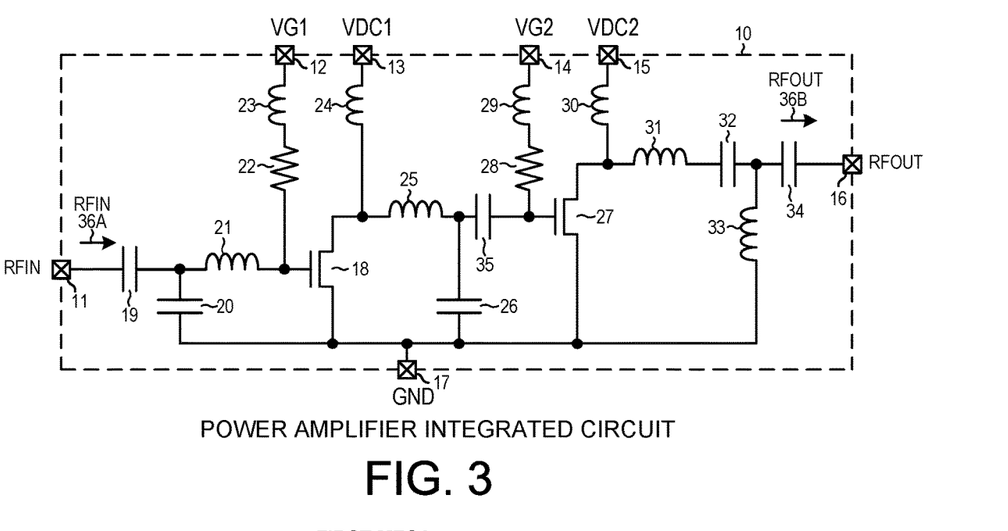
FIG. 3 is a simplified circuit diagram of a millimeter wave Monolithic Microwave Integrated Circuit (MMIC) power amplifier integrated circuit having a transistor 27.

FIG. 3 is a simplified circuit diagram of a millimeter wave Monolithic Microwave Integrated Circuit (MMIC) power amplifier integrated circuit 10. The dashed rectangular line in the illustration represents the edges of the integrated circuit 10. The integrated circuit 10 has external terminals 11-17. The power amplifier circuit itself has two stages. The first stage includes a first transistor 18, as well as passive components 19-26. The second stage includes a second transistor 27 as well as passive components 28-34. Capacitor 35 couples the signal output of the first stage into the second stage. The transistors 18 and 27 are mesa-type pHMET-type GaAs transistors (gallium arsenide pseudomorphic High Electron Mobility Transistors). An input RF signal 36A to be amplified is supplied to the integrated circuit onto terminal RFIN 11. The amplified RF output signal 36B is supplied out of the integrated circuit via terminal RFOUT 16.

Figure 4:
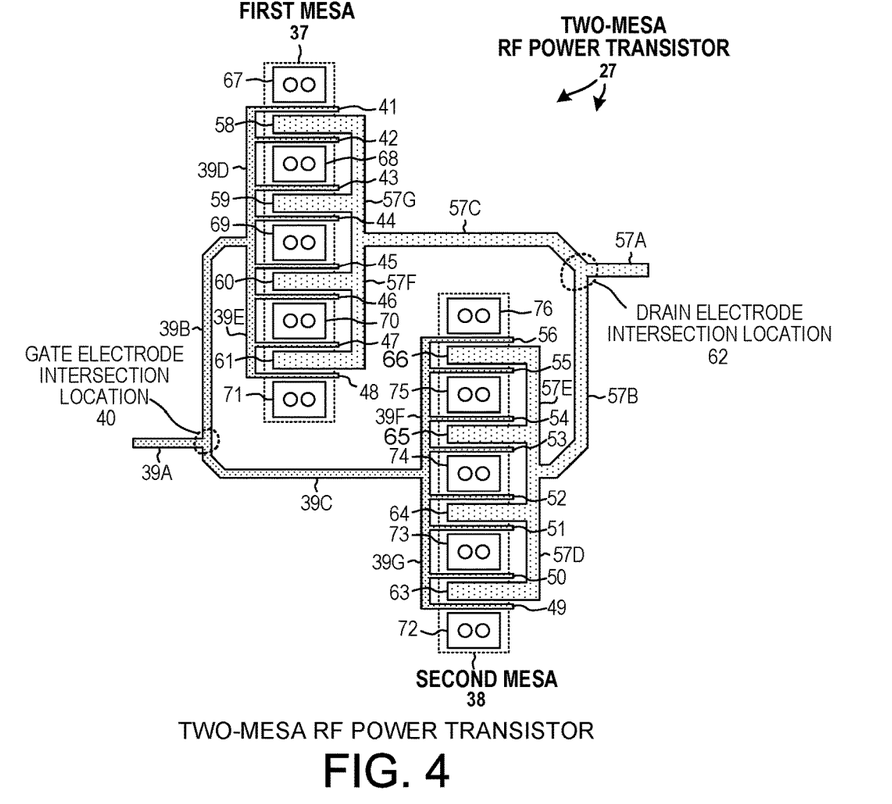
FIG. 4 is a simplified top-down diagram of the layout of the structure of transistor 27 of FIG. 3.

FIG. 4 is a simplified top-down diagram of the layout of the structure of transistor 27. The transistor structure includes two columns of transistor units. The first column is part of a first elongated mesa 37. The second column is part of a second elongated mesa 38.

A branched gate electrode 39A-39G extends from a gate electrode intersection location 40 to a first plurality of parallel-extending gate fingers 41-48 of the first mesa 37 and to a second plurality of parallel-extending gate fingers 49-56 of the second mesa 38. A branched drain electrode 57A-57G extends from a first plurality of parallel-extending drain fingers 58-61 of the first mesa 37 to a drain electrode intersection location 62 and from a second plurality of parallel-extending drain fingers 63-66 of the second mesa 38 to the drain electrode intersection location 62. Reference numerals 67-71 represent rectangular source electrodes of the first mesa 37. Reference numerals 72-76 represent rectangular source electrodes of the second mesa 38. All the electrodes in the structure are formed of metal.

Figure 5:
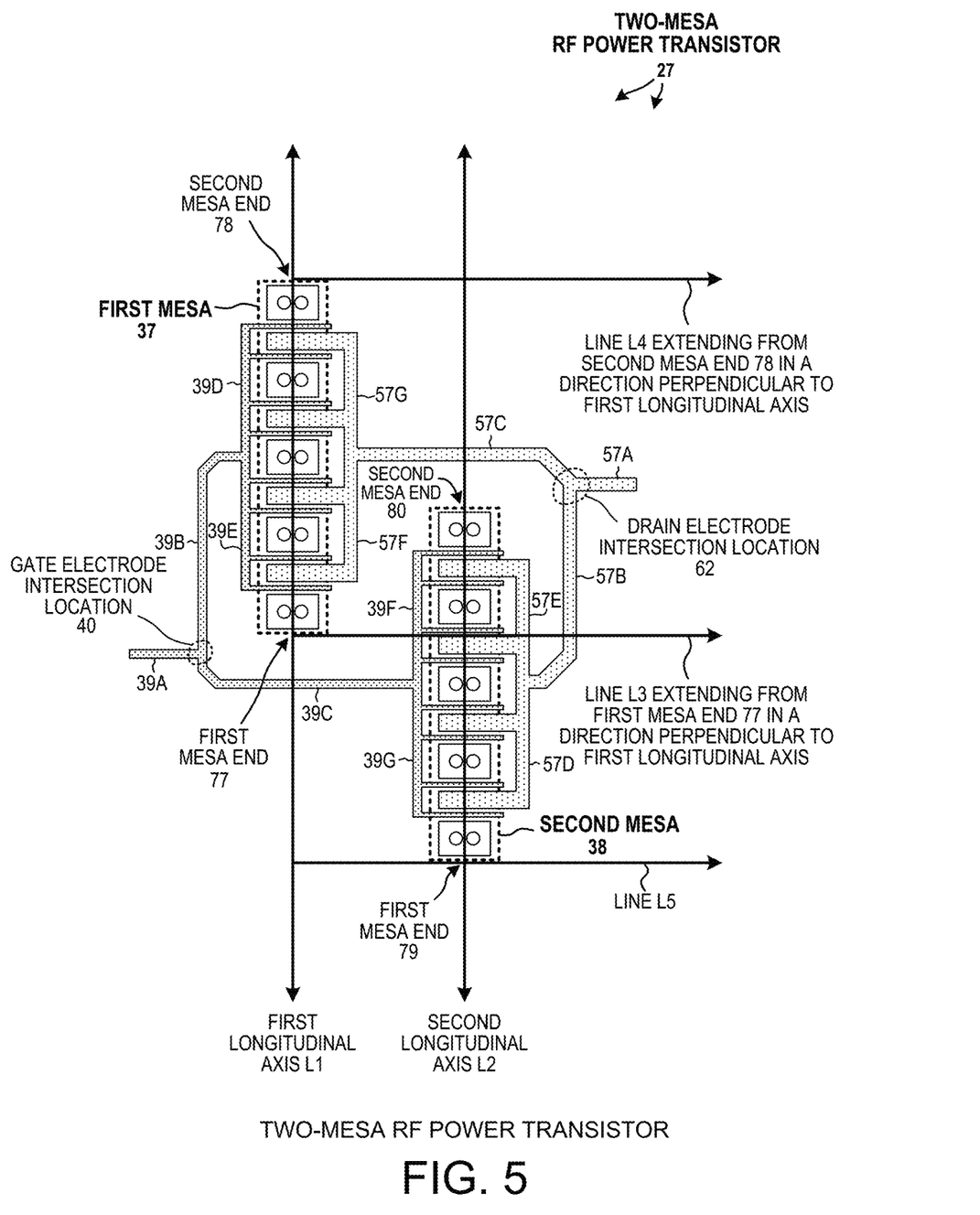
FIG. 5 is a simplified top-down diagram of the layout of the structure of transistor 27 of FIG. 3, showing axes and lines useful in describing the orientations and locations of the various parts of the structure.

FIG. 5 is a simplified top-down diagram of the layout of the structure of transistor 27, showing axes and lines useful in describing the relative orientations and locations of the various parts of the structure. The first mesa 37 is rectangular when viewed from the top-down perspective. First mesa 37 extends longitudinally along a first longitudinal axis L1 from a first mesa end 77 to a second mesa end 78. Likewise, the second mesa 38 is rectangular when viewed from the top-down perspective. Second mesa 38 extends longitudinally along a second longitudinal axis L2 from a first mesa end 79 to a second mesa end 80. The first longitudinal axis L1 and the second longitudinal axis L2 are parallel to one another. A line L3 extending from the first mesa end 77 of the first mesa 37 in a direction perpendicular to the first longitudinal axis L1 intersects the second longitudinal axis L2 and also passes through the second mesa 38. A line L4 extending from the second mesa end 78 of the first mesa 37 in a direction perpendicular to the first longitudinal axis L1 intersects the second longitudinal axis L2 but does not pass through the second mesa 38. The first longitudinal axis L1, the second longitudinal axis L2, the line L3 and the line L4 are all disposed in a single plane. The first longitudinal axis L1 extends through the first mesa 37. The second longitudinal axis L2 extends through the second mesa 38.

In the transistor structure of FIG. 4 and FIG. 5, the line L4 extends perpendicularly to the longitudinal directions of the two mesas. This line L4 extends along the uppermost extent of the structure along the second mesa end 78 of the first mesa 37. Also, a line L5 extends along the lowermost extent of the structure along the first mesa end 79 of the second mesa 38. Importantly, the two mesas 37 and 38 have a combined total longitudinal length that exceeds the distance between lines L4 and L5. The sum of the distance D1 from first mesa end 77 to second mesa end 78 and the distance D2 from first mesa end 79 and second mesa end 80 is larger than the distance D3 between lines L5 and L4. The off-axis layout of the mesas allows the overall transistor structure to be reduced in size in the dimension perpendicular to signal flow. In the illustration of FIG. 4, the dimension of signal flow is from left to right. The direction perpendicular to this signal flow direction, which is the vertical dimension in the illustration, is sometimes called the "critical dimension" in the overall layout because it is undesirable for the transistor to be too large in this dimension. This dimension is critical in many MIMO or phase array active antenna applications. The off-axis layout of the transistor structure of FIG. 4 as described above advantageously allows the size of the transistor structure in the critical dimension to be reduced.

The branched gate electrode 39A-39G is formed such that the gate electrode section 39B is of the same length as gate electrode section 39C. Gate electrode sections 39D and 39E are co-linear and form the backbone of a comb-shaped gate electrode structure. This comb-shaped gate electrode structure has parallel-extending gate fingers. Gate electrode section 39B joins with gate electrode sections 39D and 39E at the comb backbone midpoint where the sections 39D and 39E join. Gate electrode sections 39F and 39G are co-linear and form the backbone of a comb-shaped gate electrode structure. This comb-shaped gate electrode structure has parallel-extending gate fingers. Gate electrode section 39C joins with gate electrode sections 39F and 39G at the comb backbone midpoint where the sections 39F and 39G join.

The branched drain electrode 57A-57G is formed such that the drain electrode section 57B is the same length as drain electrode section 57C. Drain electrode sections 57D and 57E are co-linear and form the backbone of a comb-shaped drain electrode structure. This comb-shaped drain electrode structure has parallel-extending drain fingers. Drain electrode section 57B joins with drain electrode sections 57D and 57E at the comb backbone midpoint where the sections 57D and 57E join. Drain electrode sections 57F and 57G are co-linear and form the backbone of a comb-shaped drain electrode structure. This comb-shaped drain electrode structure has parallel-extending drain fingers. Drain electrode section 57C joins with drain electrode sections 57F and 57G at the comb backbone midpoint where the sections 57F and 57G join.

Figure 6:
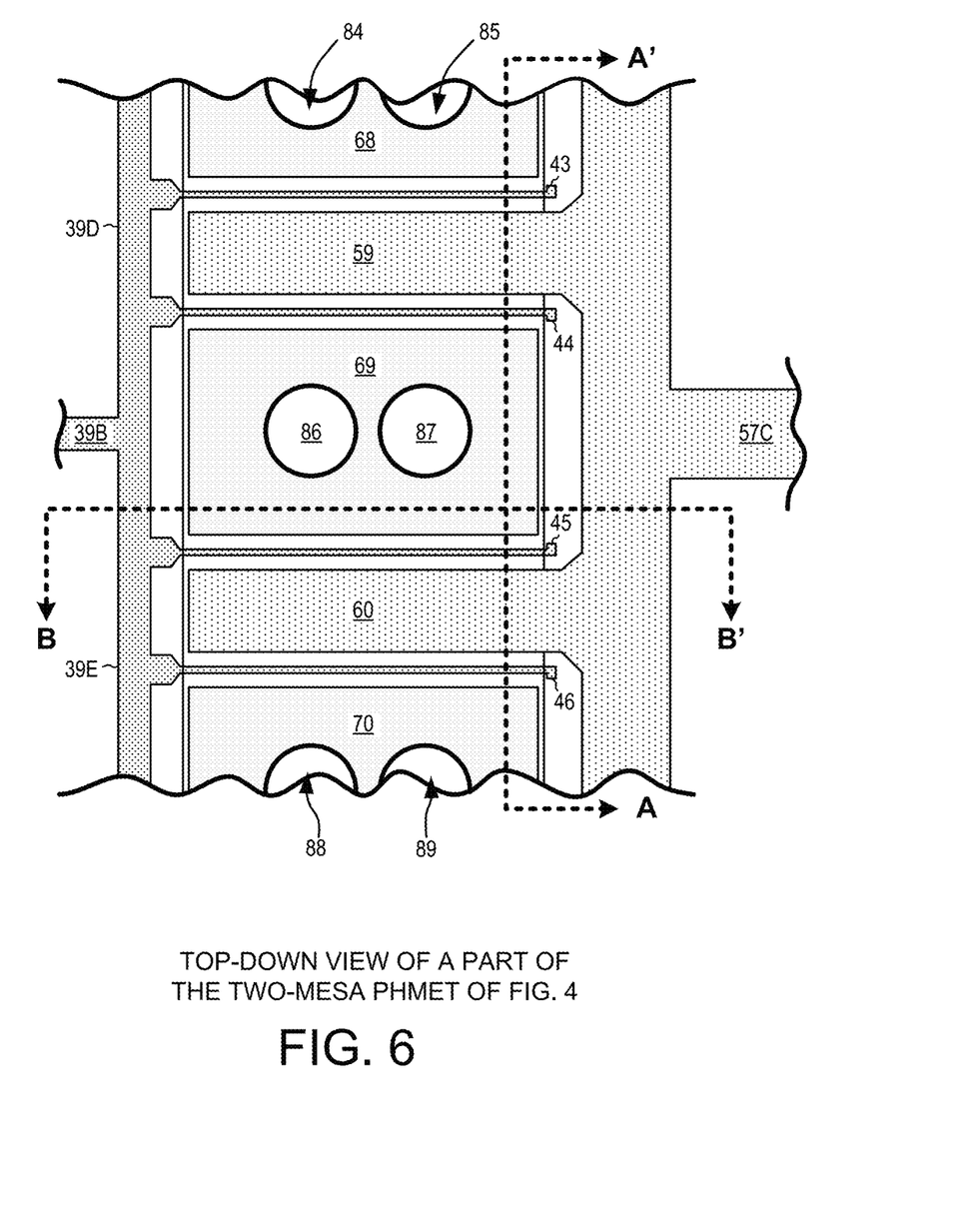
FIG. 6 is a top-down diagram of a part of the structure of first mesa 37 of FIG. 4.

FIG. 6 is a top-down diagram of a part of the structure of mesa 37. A semi-insulating GaAs buffer layer 81 is disposed over a semi-insulating GaAs substrate 82, and the two mesa structures 37 and 38 are disposed over the semi-insulating GaAs buffer layer 81. Layer 83 is a layer of metal disposed on the bottom-side of the substrate 82. The circles 84-89 in the illustration of FIG. 6 represent cylindrical metal-filled through-chip vias. These vias extend downward from rectangular source electrodes on the top of the mesa, down through the various semiconductor layers of the integrated circuit, to make contact with metal layer 83 on the bottom of the integrated circuit.

Figure 7:
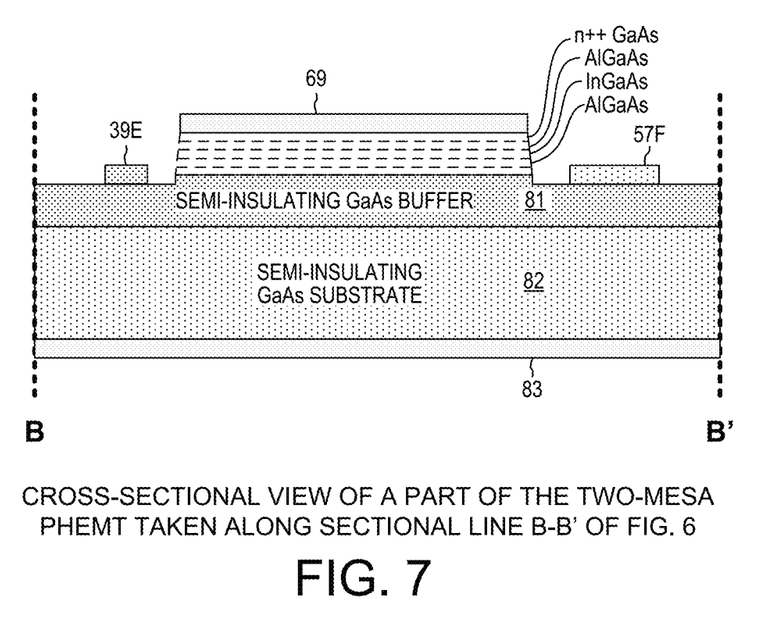
FIG. 7 is a simplified cross-sectional diagram taken along sectional line B-B' of FIG. 6.

FIG. 7 is a simplified cross-sectional diagram taken along sectional line B-B' of FIG. 6.

Figure 8:
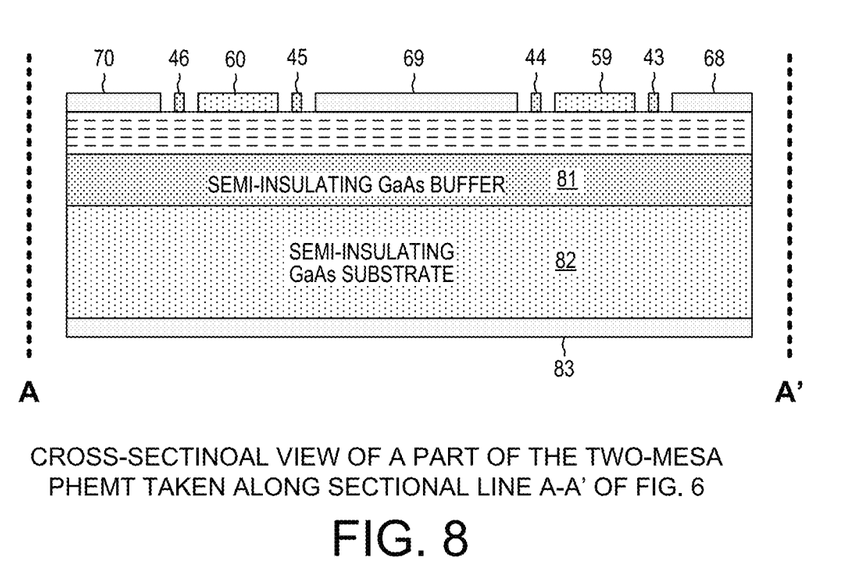
FIG. 8 is a simplified cross-sectional diagram taken along sectional line A-A' of FIG. 6.

FIG. 8 is a simplified cross-sectional diagram taken along sectional line A-A' of FIG. 6.

The off-axis layout of mesas described above is extendable to transistor structures that include more than two mesas. The mesas of a single transistor structure can be aligned along three or more parallel-extending longitudinal axes. Also, two or more identical mesas can be oriented along a common longitudinal axis. The mesas of the transistor structure are laid out in staggered off-axis fashion, and then a branched gate electrode is laid out so signal path lengths from a common gate electrode input location to the various mesa are as uniform as possible. Similarly, a branched drain electrode is laid out so the signal path lengths from the various mesas to a single common drain electrode output location are as uniform as possible. Connection of the branched gate electrode to the backbones of the various comb-shaped gate electrode structures is at the center points of the backbones as illustrated in FIG. 4 and FIG. 5. Likewise, connection of the branched drain electrode to the backbones of the various comb-shaped drain electrode structures is at the center points of the backbones as illustrated in FIG. 4 and FIG. 5.

Figure 9:
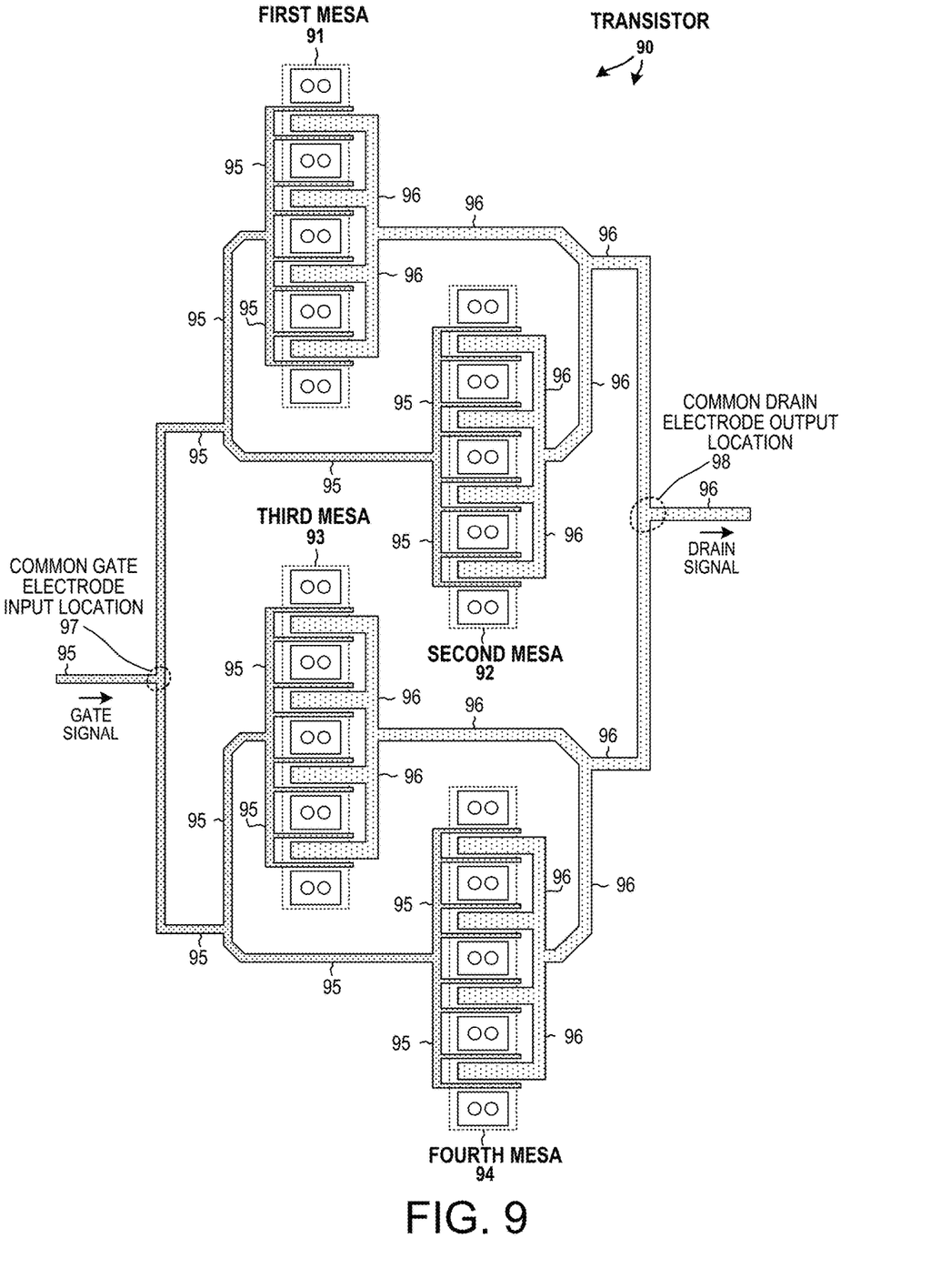
FIG. 9 is a diagram of an off-axis transistor structure that has four mesas.

FIG. 9 is a top-down diagram of an off-axis transistor structure 90 having four mesas 91-94, a branched gate electrode 95, and a branched drain electrode 96. Although the leftmost incoming gate electrode section is offset in the vertical dimension with respect to the outgoing rightmost drain electrode section, it is understood that the gate and drain electrodes can be laid out such that leftmost incoming gate electrode section and the rightmost outgoing drain electrode section are colinear and are not offset in the vertical dimension with respect to one another. This is accomplished while still maintaining the desired identical signal path length from a common gate electrode input location 97 to the various mesas by bending and shaping the gate electrode appropriately. Likewise, the desired identical signal path length from the various mesas to a common drain electrode output location 98 is accomplished by bending and shaping the drain electrode appropriately.

In the description above, the term integrated circuit is used as a broad term that encompasses both a bare integrated circuit die as well as a packaged integrated circuit. Similarly, the term terminal is used as a broad term that encompasses both a pad on an integrated circuit die as well as a package terminal of a packaged integrated circuit. A terminal as the term is used here may include an integrated circuit bond pad, a package terminal, as well as a bond wire or substrate connection or other electrical connection that couples the pad to the package terminal. The term semiconductor device is a broad term that encompasses both an integrated circuit die as well as a packaged integrated circuit or a packaged multi-chip module, including the devices contained in the package as well as the outer package of any such semiconductor device.

Although certain specific embodiments are described above for instructional purposes, the teachings of this patent document have general applicability and are not limited to the specific embodiments described above. The off-axis layout method and technique is not limited to use in pHMET RF power transistors, but rather is also usable in other types of transistors including in bipolar transistors, and in CMOS transistors, and in HDMOS transistors. Although the specific embodiment described above is realized in GaAs, the invention can be implemented using other semiconductor technologies including GaN. Accordingly, various modifications, adaptations, and combinations of various features of the described embodiments can be practiced without departing from the scope of the invention as set forth in the claims.

What is claimed is:

1. A semiconductor device comprising:
an elongated first mesa having a first mesa end and a second mesa end, wherein the first mesa extends longitudinally along a first longitudinal axis L1 from the first mesa end of the first mesa to the second mesa end of the first mesa, wherein the first mesa comprises a plurality of semiconductor layers;
an elongated second mesa having a first mesa end and a second mesa end, wherein the second mesa extends longitudinally along a second longitudinal axis L2 from the first mesa end of the second mesa to the second mesa end of the second mesa, wherein the second mesa comprises a plurality of semiconductor layers, wherein the first longitudinal axis L1 is parallel to the second longitudinal axis L2, wherein a line L3 extending from the first mesa end of the first mesa in a direction perpendicular to the first longitudinal axis L1 intersects the second longitudinal axis L2 and also passes through the second mesa, and wherein a line L4 extending from the second mesa end of the first mesa in a direction perpendicular to the first longitudinal axis L1 intersects the second longitudinal axis L2 but does not pass through the second mesa;

a first plurality of parallel-extending gate fingers that are at least partly disposed on the first mesa;

a second plurality of parallel-extending gate fingers that are at least partly disposed on the second mesa;

a gate electrode that comprises a first gate electrode portion and a second gate electrode portion, wherein the first gate electrode portion extends from a gate electrode intersection location to the first plurality of parallel-extending gate fingers, and wherein the second gate electrode portion extends from the gate electrode intersection location to the second plurality of parallel-extending gate fingers;

a first plurality of parallel-extending drain fingers that are at least partly disposed on the first mesa;

a second plurality of parallel-extending drain fingers that are at least partly disposed on the second mesa; and a drain electrode that comprises a first drain electrode portion and a second drain electrode portion, wherein the first drain electrode portion extends from the first plurality of parallel-extending drain fingers and to a drain electrode intersection location, and wherein the second drain electrode portion extends from the second plurality of parallel extending drain fingers to the drain electrode intersection location, wherein the first drain electrode portion and the second drain electrode portion are of the same length, wherein the first longitudinal axis L1, the second longitudinal axis L2, the line L3 and the line L4 are all disposed in a single plane, wherein the first longitudinal axis L1 extends through the first mesa, and wherein the second longitudinal axis L2 extends through the second mesa.

2. The semiconductor device of claim 1, wherein the distance along the first longitudinal axis L1 from the first mesa end of the first mesa to the second mesa end of the first mesa is identical to the distance along the second longitudinal axis L2 from the first mesa end of the second mesa to the second mesa end of the second mesa.

3. The semiconductor device of claim 1, wherein the first and second mesas comprise gallium and arsenic.

4. The semiconductor device of claim 1, wherein the semiconductor device is a power amplifier integrated circuit, wherein the elongated first mesa, the elongated second mesa, the first plurality of parallel-extended gate fingers, the second plurality of parallel-extending gate fingers, the gate electrode, the first plurality of parallel-extending drain fingers, the second plurality of parallel-extending drain fingers, and the drain electrode together form a second transistor of a second transistor stage, wherein the power amplifier integrated circuit further comprises a first transistor of a first transistor stage, and wherein a signal output of the first transistor stage is coupled to a signal input of the second transistor stage.

5. The semiconductor device of claim 1, wherein the first plurality of parallel-extending drain fingers extends to a first backbone electrode portion, wherein the first plurality of parallel-extending drain fingers and the first backbone electrode portion together form a first comb-shaped drain electrode structure, wherein the second plurality of parallel-extending drain fingers extends to a second backbone electrode portion, wherein the second plurality of parallel-extending drain fingers and the second backbone electrode portion together form a second comb-shaped drain electrode structure, wherein the first drain electrode portion extends from a midpoint of the first backbone electrode portion of the first comb-shaped drain electrode structure to the drain electrode intersection location, and wherein the second drain electrode portion extends from a midpoint of the second backbone electrode portion of the second comb-shaped drain electrode structure to the drain electrode intersection location.

6. A semiconductor device comprising:

a first elongated transistor structure that extends longitudinally along a first longitudinal axis L1 from a first end of the first elongated transistor structure to a second end of the first elongated transistor structure;

a second elongated transistor structure that extends longitudinally along a second longitudinal axis L2 from a first end of the second elongated transistor structure to a second end of the second elongated transistor structure, wherein the first longitudinal axis L1 is parallel to the second longitudinal axis L2, wherein a line L3 extending from the first end of the first elongated transistor structure in a direction perpendicular to the first longitudinal axis L1 intersects the second longitudinal axis L2 and also passes through the second elongated transistor structure, and wherein a line L4 extending from the second end of the first elongated transistor structure in a direction perpendicular to the first longitudinal axis L1 intersects the second longitudinal axis L2 but does not pass through the second elongated transistor structure;

a first branched electrode that comprises a first electrode branch and a second electrode branch, wherein the first electrode branch extends from an electrode branch origination location to the first elongated transistor structure, and wherein the second electrode branch extends from the electrode branch origination location to the second elongated transistor structure, wherein the first electrode branch of the first branched electrode and the second electrode branch of the first branched electrode are of the same length;

a second branched electrode that comprises a first electrode branch and a second electrode branch, wherein the first electrode branch extends from the first elongated transistor structure to an electrode branch termination location, and wherein the second electrode branch extends from the second elongated transistor structure to the electrode branch termination location, wherein the first electrode branch of the second branched electrode and the second electrode branch of the second branched electrode are of the same length;

a semiconductor substrate layer having a bottom surface;

a bottomside metal electrode layer disposed on the bottom surface of the semiconductor substrate layer;

a first plurality of via electrodes that are at least in part disposed on the first elongated transistor structure;

a second plurality of via electrodes that are at least in part disposed on the first elongated transistor structure;

a first plurality of conductive vias that extend from the first plurality of via electrodes, and down through the first elongated transistor structure, and down through the semiconductor substrate layer, to the bottomside metal electrode layer; and a second plurality of conductive vias that extend from the second plurality of via electrodes, and down through the second elongated transistor structure, and down through the semiconductor substrate layer, to the bottomside metal electrode layer, wherein the first elongated transistor structure, the second elongated transistor structure, the first branched electrode, the second branched electrode, the first plurality of via electrodes, the second plurality of via electrodes, the first plurality of conductive vias and the second plurality of conductive vias together form a single transistor.

7. The semiconductor device of claim 6, wherein the semiconductor device is a packaged integrated circuit, and wherein the single transistor is a part of the integrated circuit.

8. The semiconductor device of claim 6, wherein the semiconductor substrate comprises gallium and arsenic.

* * * * *